(12) United States Patent
Naito

(10) Patent No.: US 6,888,393 B2
(45) Date of Patent: May 3, 2005

(54) AMPLITUDE LIMITING APPARATUS AND MULTI-CARRIER SIGNAL GENERATING APPARATUS

(75) Inventor: Masashi Naito, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 10/631,889

(22) Filed: Aug. 1, 2003

(65) Prior Publication Data

US 2004/0090283 A1 May 13, 2004

(30) Foreign Application Priority Data

Sep. 4, 2002 (JP) ........................................ 2002-259023
Oct. 23, 2002 (JP) ........................................ 2002-307881

(51) Int. Cl.[7] ................................................ H03L 5/00
(52) U.S. Cl. ........................................ 327/309; 306/306
(58) Field of Search .............................. 327/306, 309, 327/311, 321

(56) References Cited

U.S. PATENT DOCUMENTS 5,185,679 A * 2/1993 Mishima et al. .............. 360/30

FOREIGN PATENT DOCUMENTS

| JP | A 11-313042 | 11/1999 |
|----|-------------|---------|
| JP | 2000-106548 | 4/2000 |
| JP | A 2001-274768 | 10/2001 |
| JP | A 2001-339361 | 12/2001 |
| JP | A 2002-44052 | 2/2002 |
| JP | A 2002-44054 | 2/2002 |
| JP | A 2002-77097 | 3/2002 |
| JP | 2002-305489 | 10/2002 |

OTHER PUBLICATIONS

Nikkei Electronics, Apr. 8, 2002, pp. 102–127 (in Japanese).

* cited by examiner

Primary Examiner—Dinh T. Le
(74) Attorney, Agent, or Firm—Oliff & Berridge, PLC

(57) ABSTRACT

A peak level of amplitude of transmission signals in a multi-carrier communication system or the like is to be effectively suppressed. A transmission data generating unit generates digital transmission data from original data by an OFDM system. A limiter of a peak suppressing unit limits a level of transmission data using thresholds. A subtractor subtracts output data of the limiter from the transmission data to generate differential data. A subtractor suppresses the peak level by subtracting the differential data from transmission data whose timing is coordinated by delay units. A transmitter unit converts the transmission data whose peak level is suppressed into analog transmission signals, further converts their frequency, amplifies their power, and transmits the frequency-converted and power-amplified signals to a radio line via an antenna.

10 Claims, 20 Drawing Sheets

[FIG. 1]
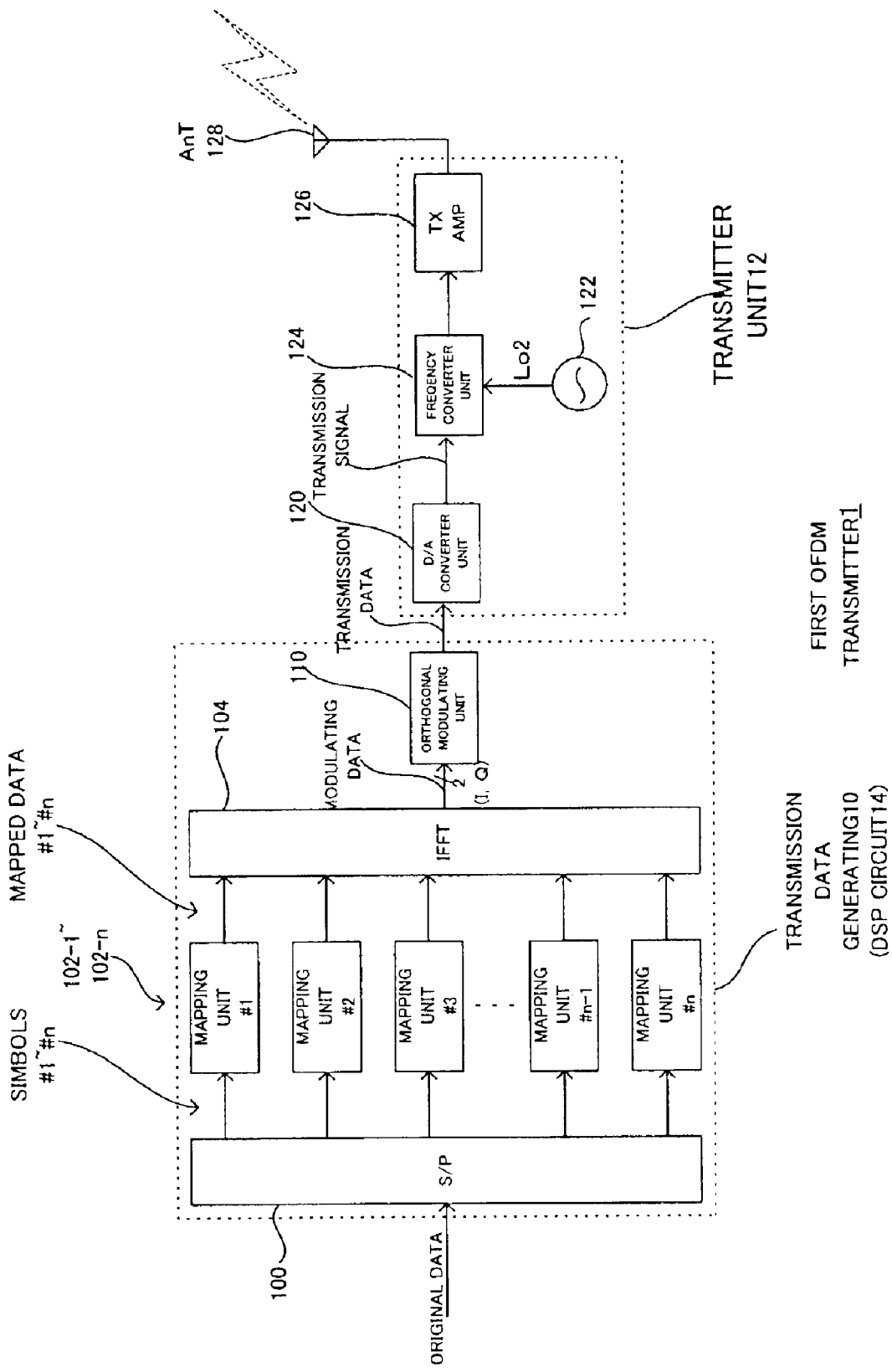

[FIG. 2]
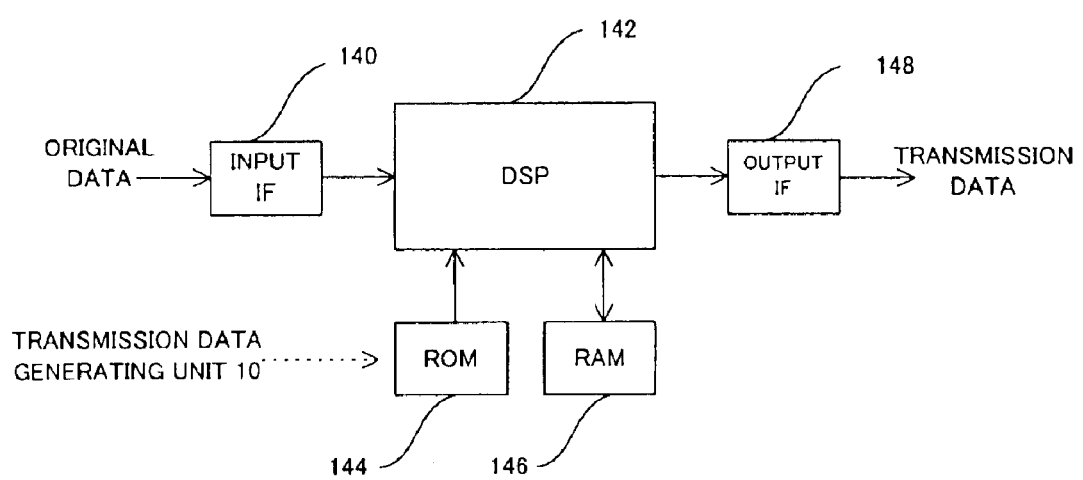
DSP UNIT CIRCUIT 14

[FIG. 3]
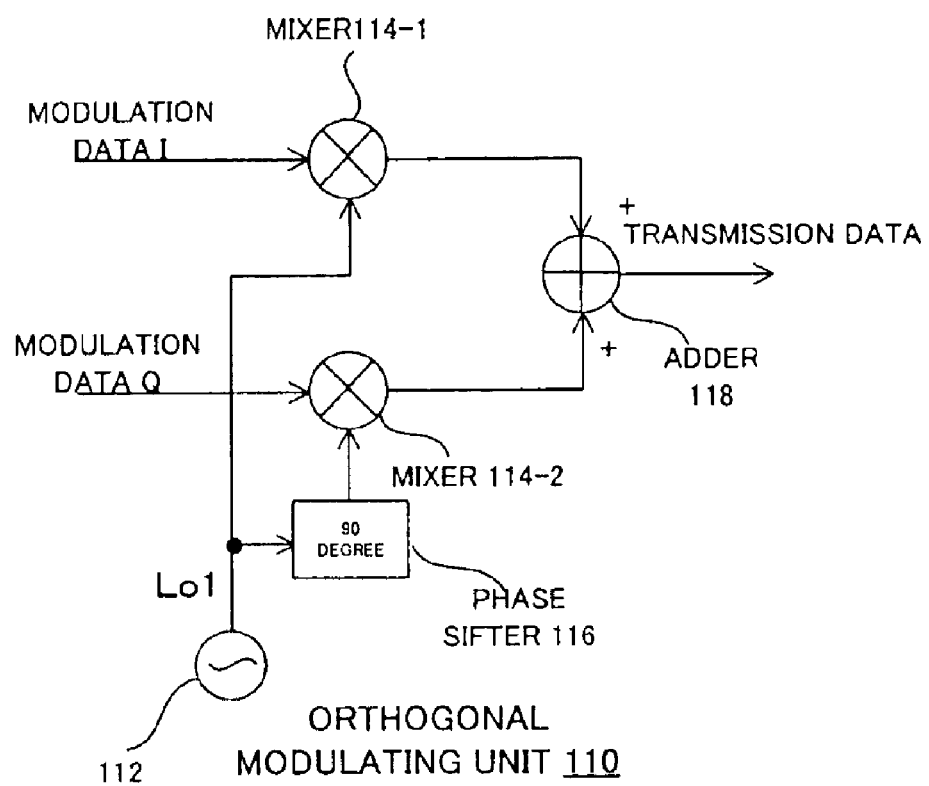

[FIG. 4]
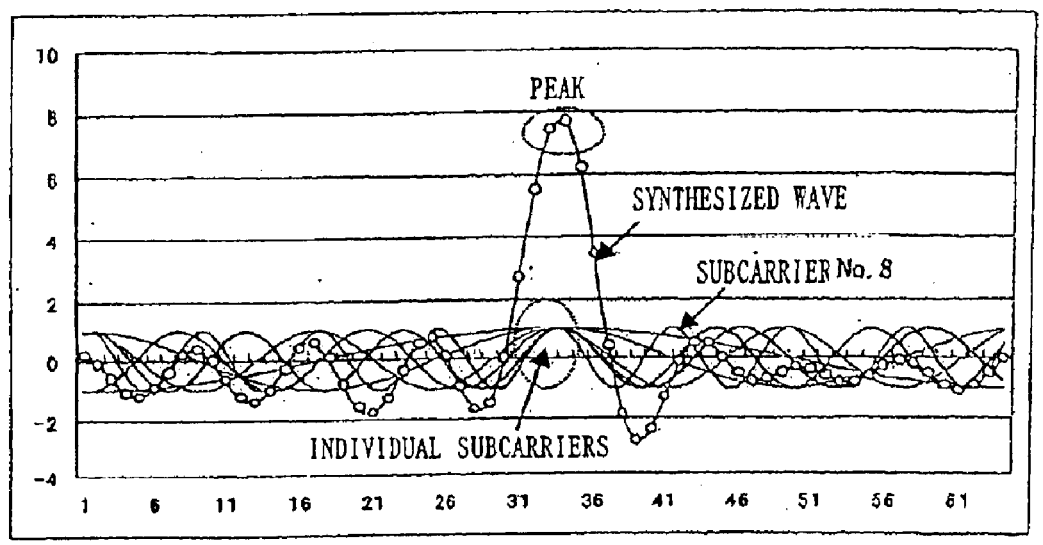

[FIG. 5]
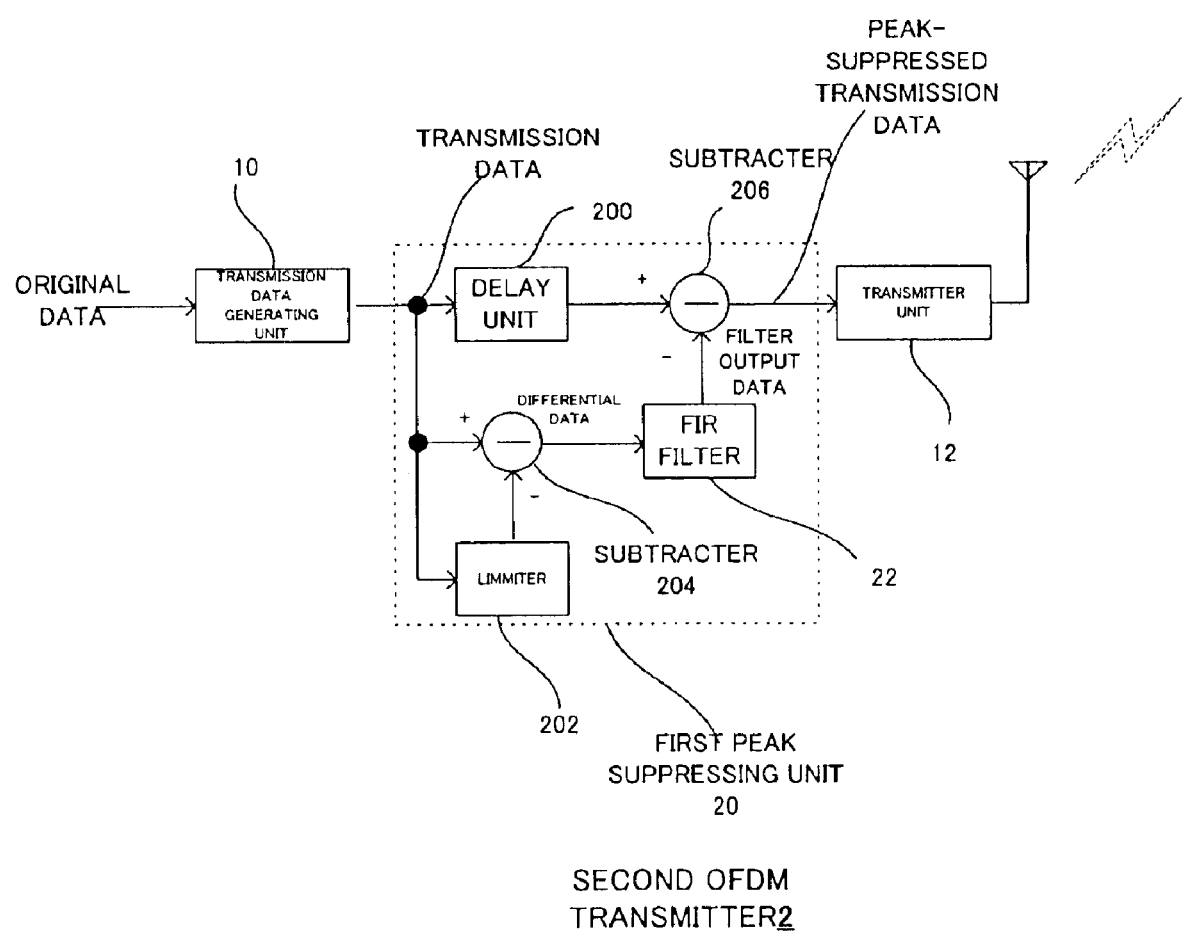

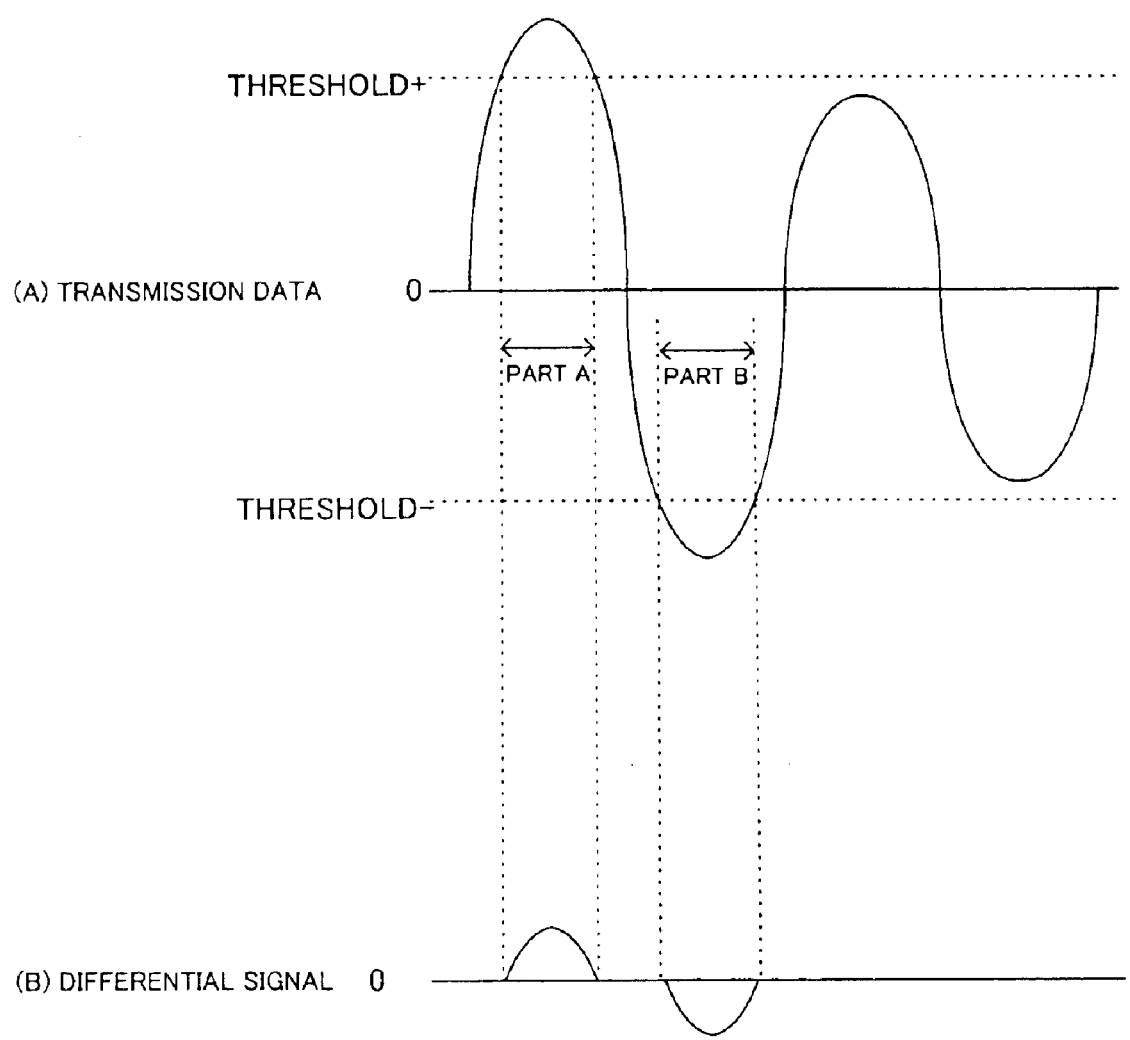

[FIG. 7]
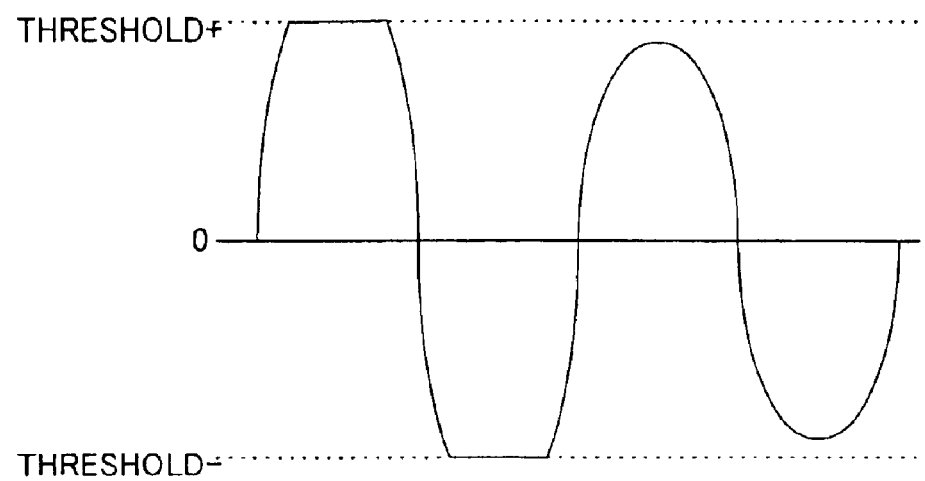
[FIG. 12]
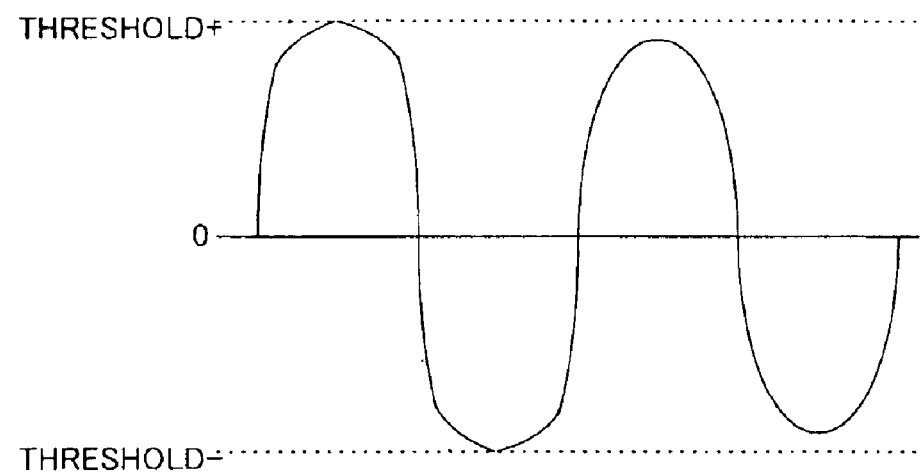

[FIG. 8]
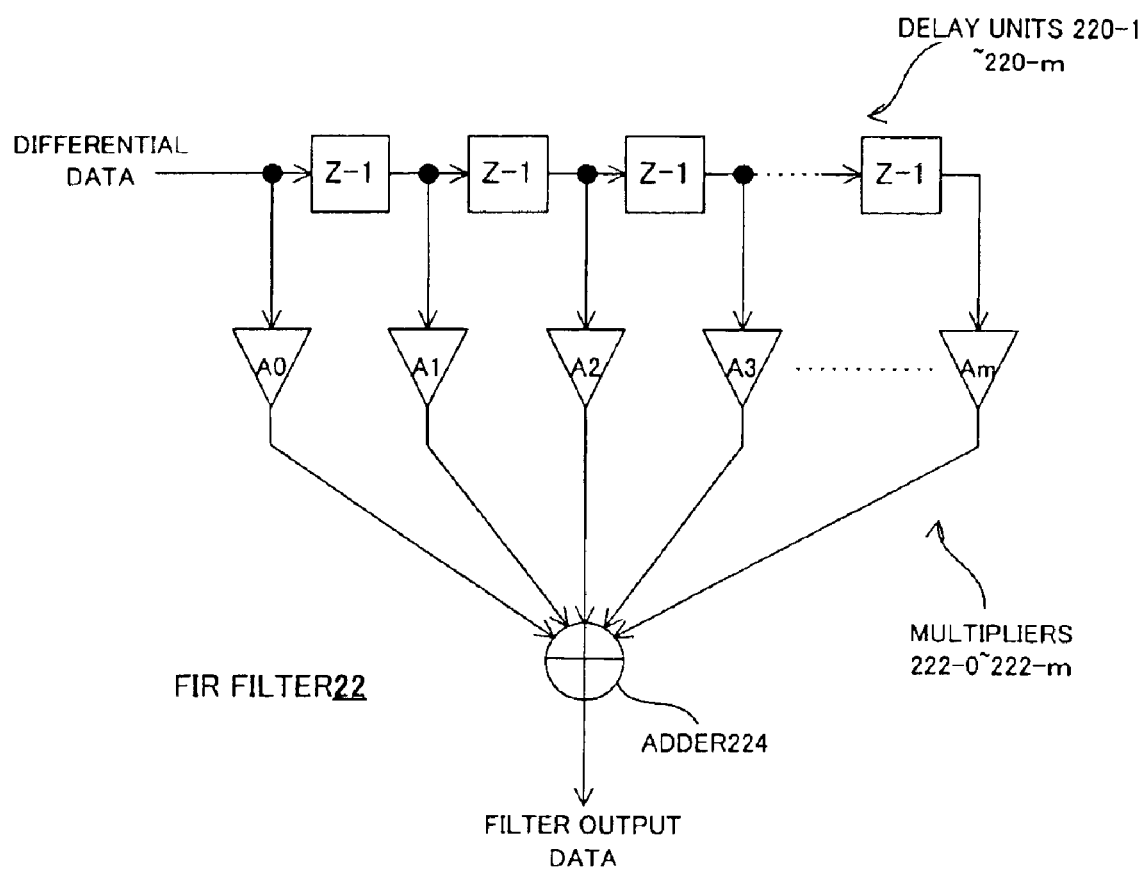

[FIG. 9]
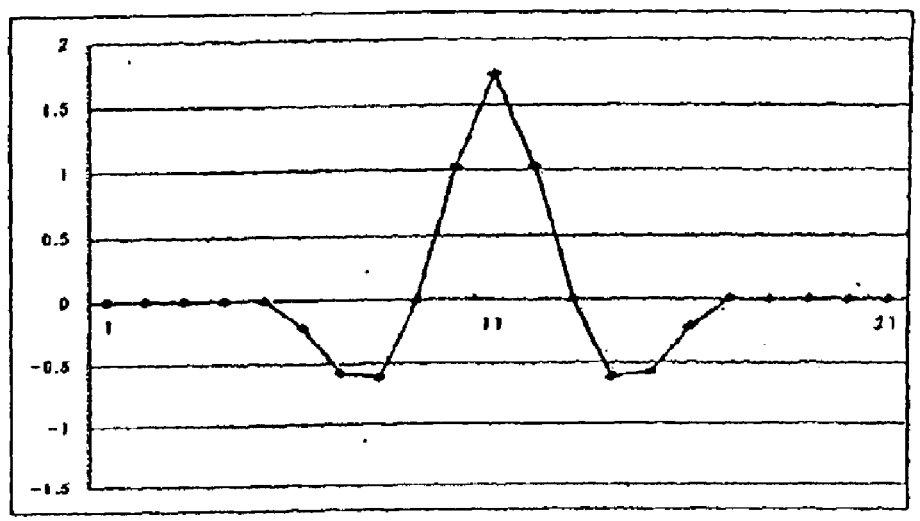
[FIG. 10]
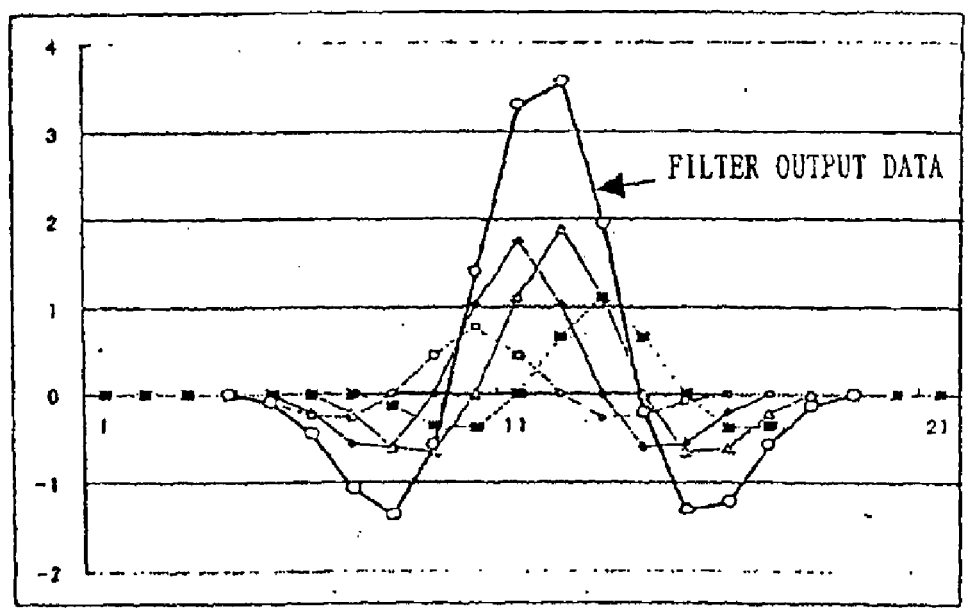

[fig. 11]
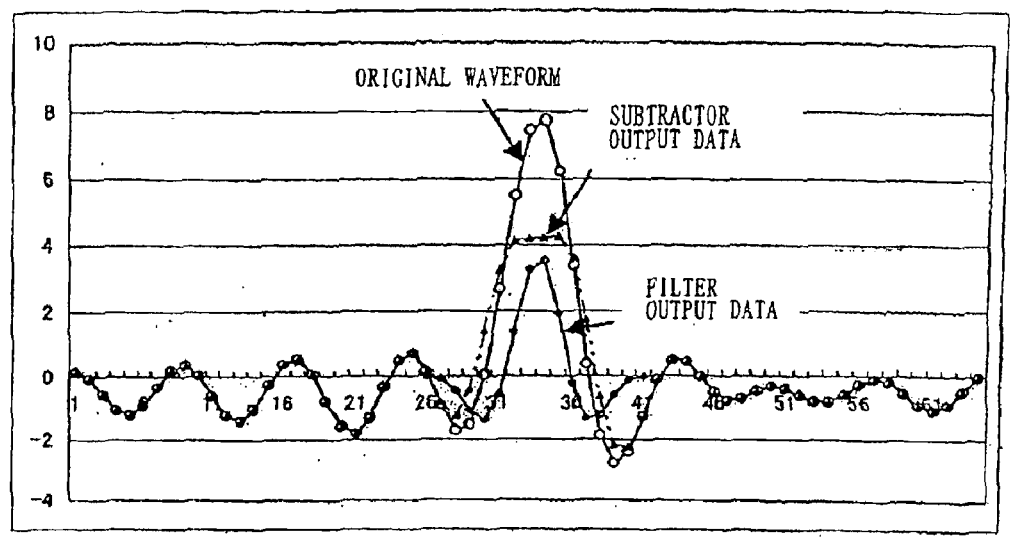

[FIG. 13]
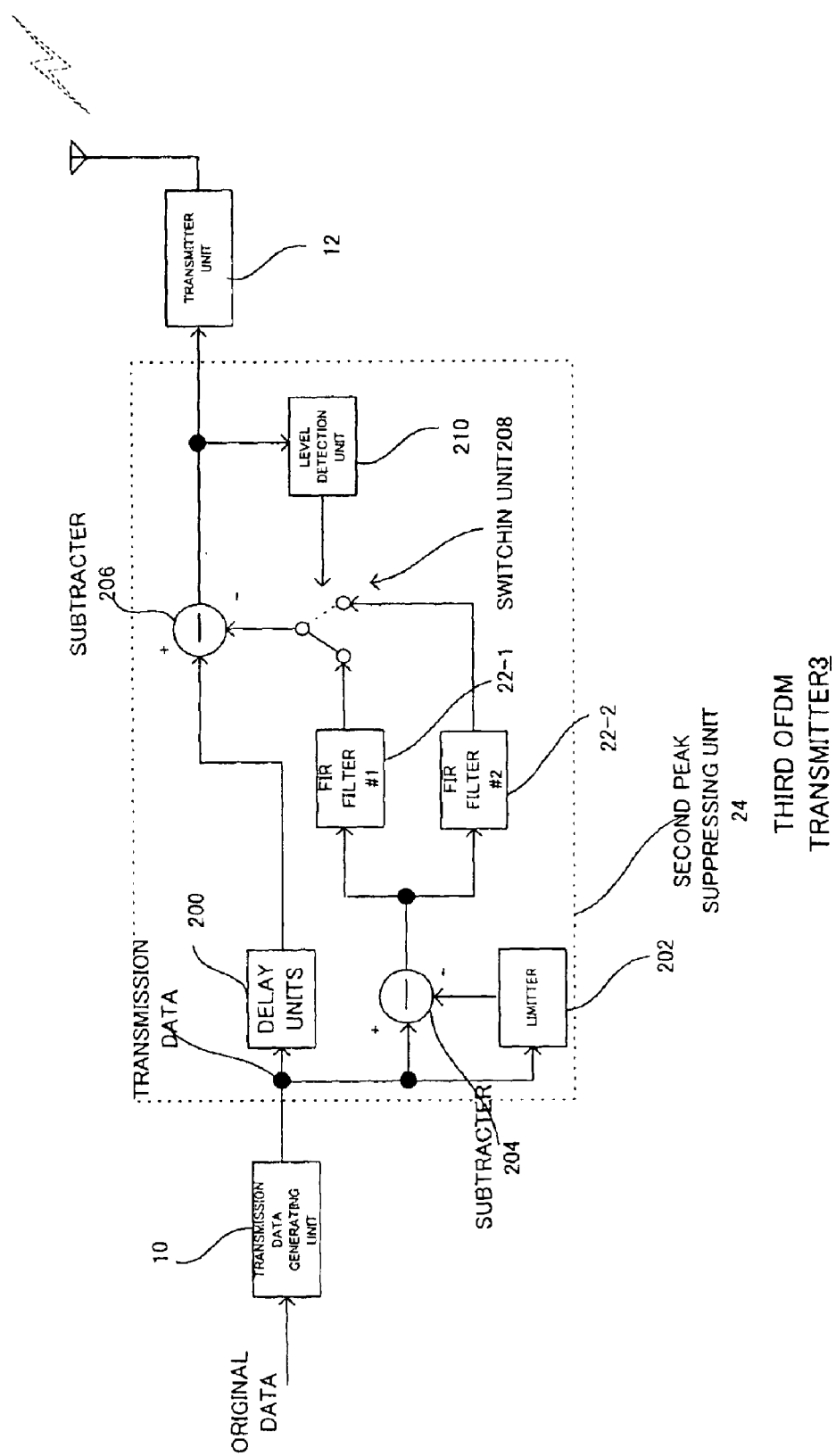

[FIG. 14]
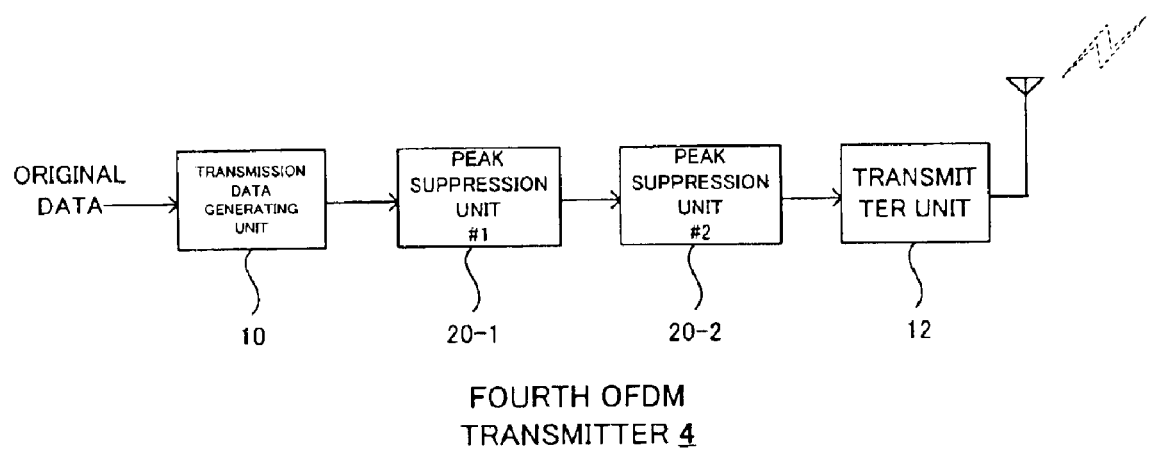
FOURTH OFDM
TRANSMITTER 4

[FIG. 15]
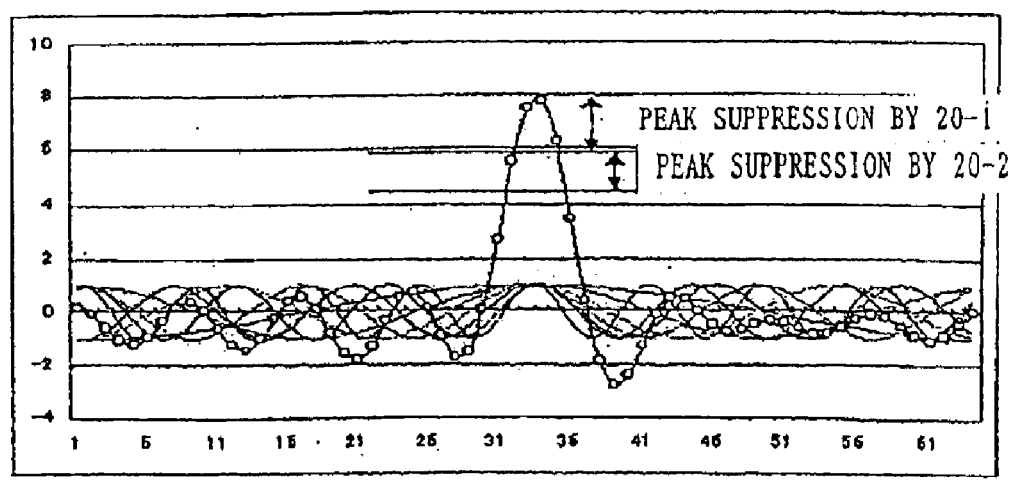

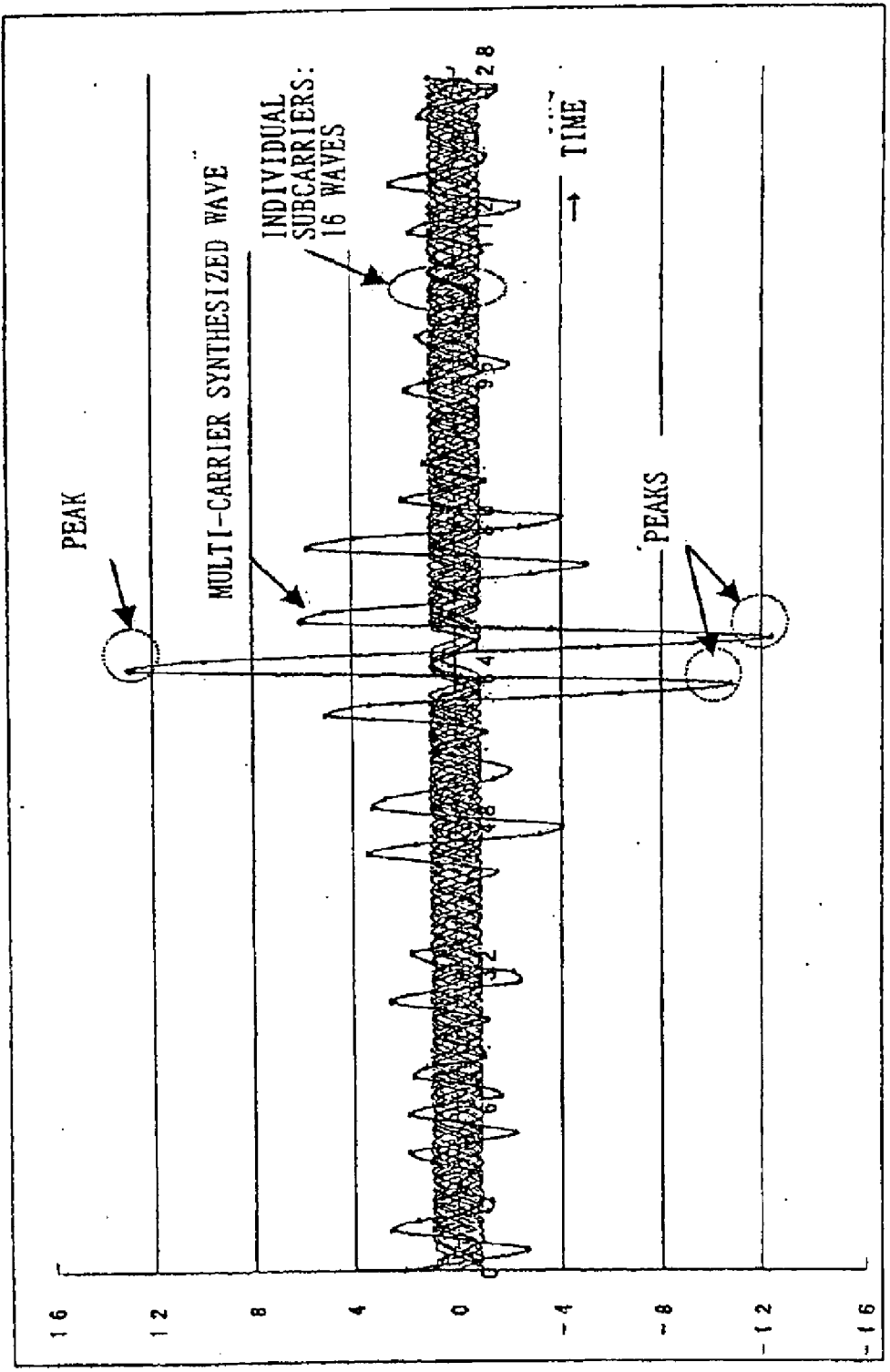

[FIG. 17]
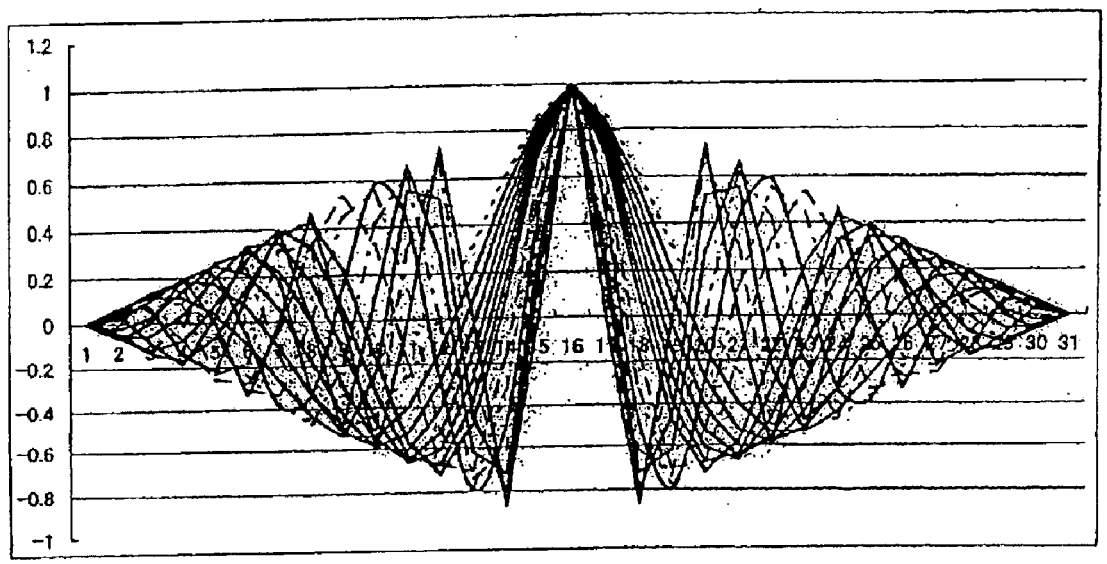
[FIG. 18]
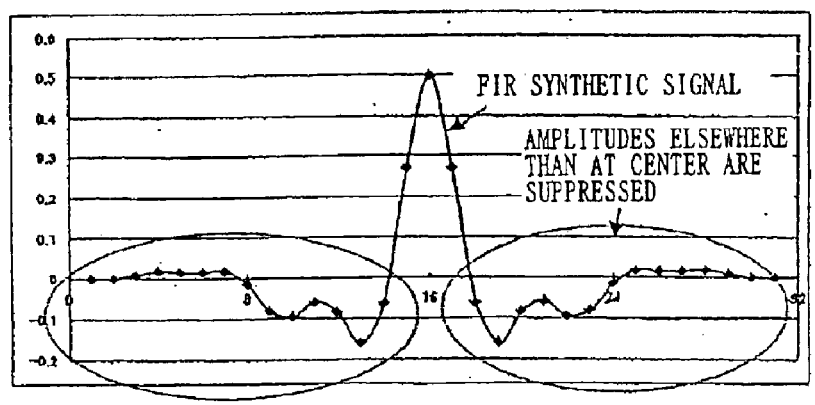

[FIG. 19]
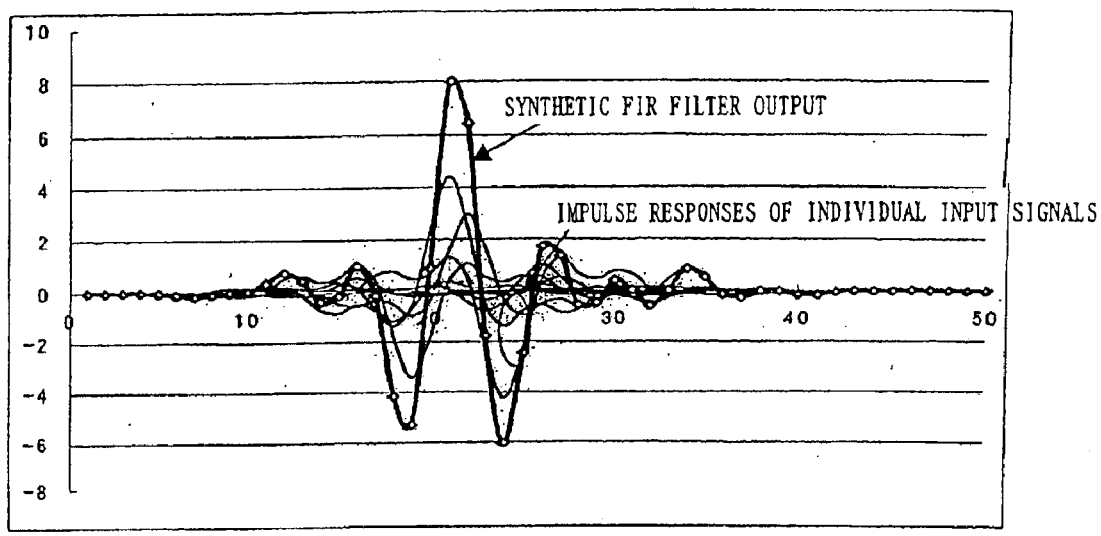

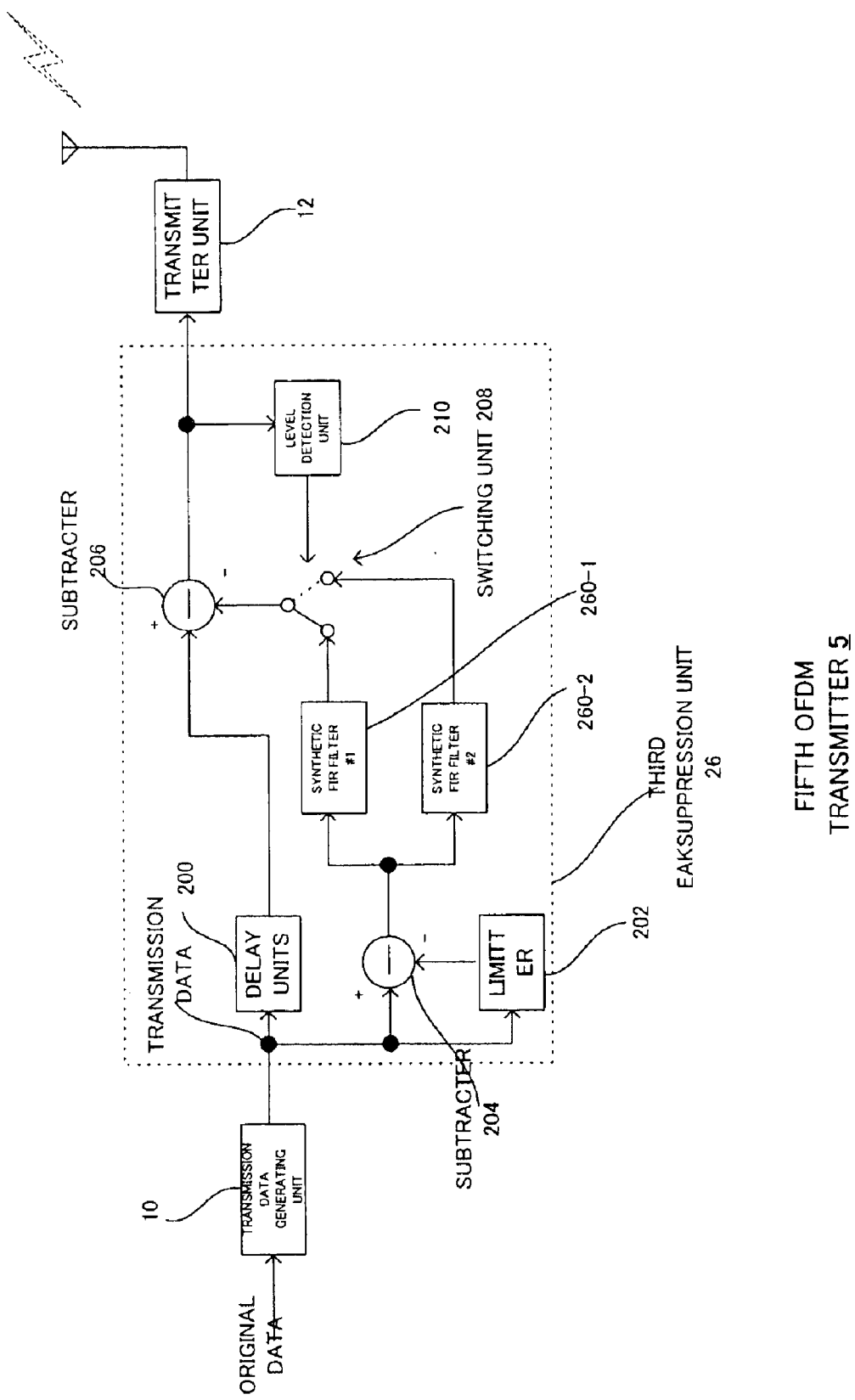
[FIG. 20].

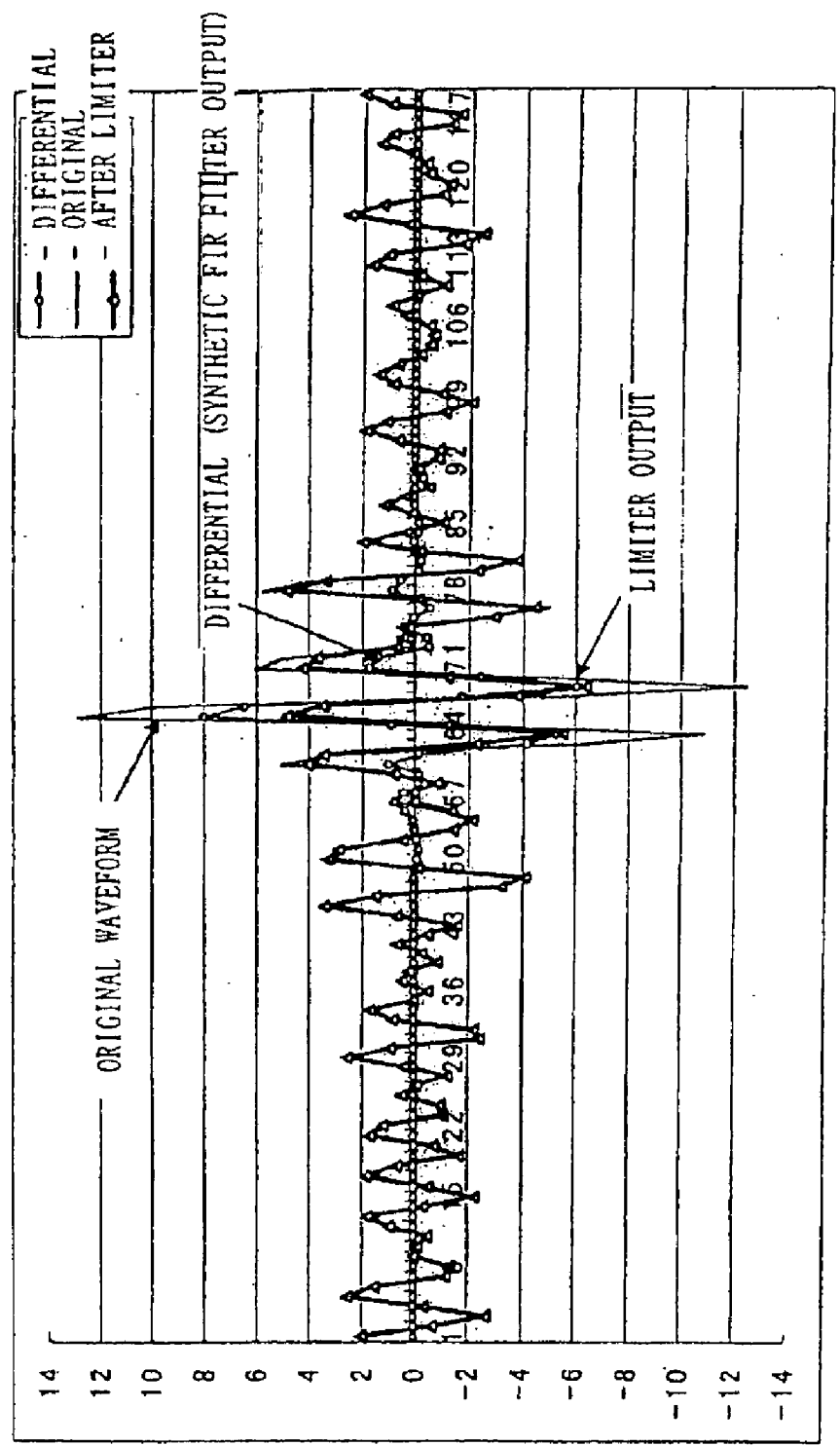
[FIG. 21]

[FIG. 22]
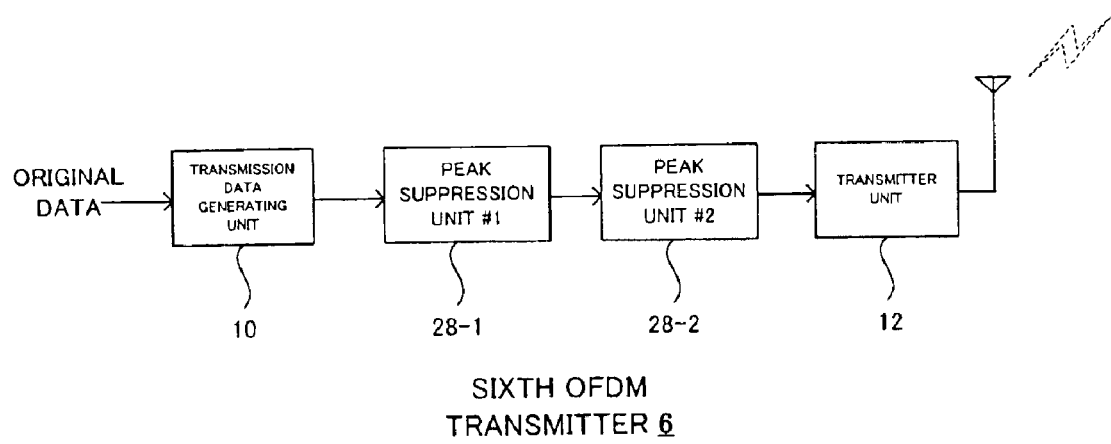
SIXTH OFDM
TRANSMITTER 6

[FIG. 23]
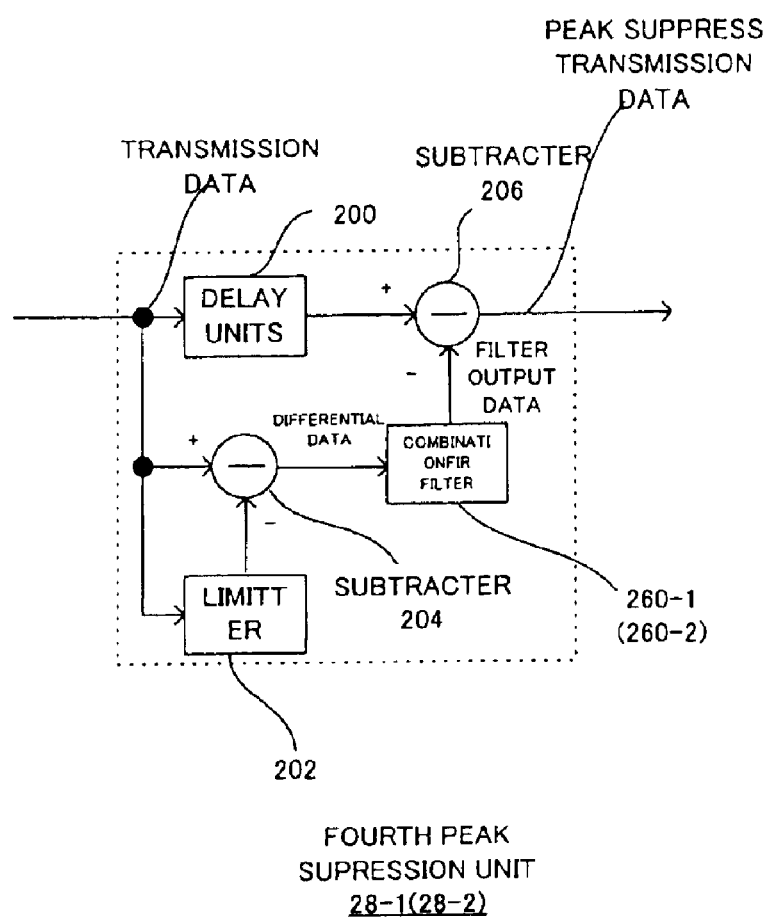
FOURTH PEAK
SUPRESSION UNIT
28-1(28-2)

US 6,888,393 B2

AMPLITUDE LIMITING APPARATUS AND MULTI-CARRIER SIGNAL GENERATING APPARATUS

BACKGROUND OF THE INVENTION

1. Field of the Invention

The present invention relates to an amplitude limiting apparatus for limiting the amplitude of signals.

2. Description of the Related Art

For instance, Patent Reference 1 discloses an orthogonal frequency division multiplex (OFDM) system as a multi-carrier communication system for transmitting data by use of multiple carriers.

Patent References 2 through 7 disclose methods by which the peak level of transmission signals in a multi-carrier communication system or the like is suppressed in order to reduce nonlinear distortions, occurring from their amplification, in nonlinear portions of the amplification characteristics of the power amplifier.

[Patent Reference 1] Nikkei Electronics (Apr. 8, 2002, pp. 102 to 127) (in Japanese)

[Patent Reference 2] Japanese published unexamined patent application 2001-339361

[Patent Reference 3] Japanese published unexamined patent application 2002-44052

[Patent Reference 4] Japanese published unexamined patent application 2002-77079

[Patent Reference 5] Japanese published unexamined patent application Hei 11-313042

[Patent Reference 6] Japanese published unexamined patent application 2002-44054

[Patent Reference 7] Japanese published unexamined patent application 2001-274768

SUMMARY OF THE INVENTION

An object of the present invention, in view of the background circumstances stated above, is to provide an amplitude limiting apparatus capable of effectively suppressing the peak level of the amplitude of transmission signals in a multi-carrier communication system or the like.

[Amplitude Limiting Apparatus]

In order to achieve the object stated above, an amplitude limiting apparatus according to the invention has differential signal generating means for generating a differential signal representing a difference between a portion of a subject signal to be limited in amplitude in excess of any limit prescribed for the amplitude of the subject signal and the limit, and amplitude limiting means for limiting the amplitude of the subject signal by subtracting the generated differential signal from the subject signal.

Preferably, the amplitude limiting apparatus should further have filtering means for filtering the generated differential signal to pass only a prescribed band content of the differential signal, wherein the amplitude limiting means limits the amplitude of the subject signal by subtracting the filtered differential signal from the subject signal.

Preferably, the subject signal should be in a digital form, and each of the differential signal generating means, the amplitude limiting means and the filtering means should carry out by digital processing respectively the generation of the differential signal, the amplitude limitation of the subject signal and the filtering of the differential signal.

Preferably, the amplitude limiting apparatus should further have mapping means for mapping digital transmission signals to be transmitted in a plurality of symbols, and IFFT processing means for subjecting the plurality of symbols obtained by the mapping to IFFT processing to generate a multi-carrier synthetic signal in a digital form containing a plurality of subcarrier components, wherein amplitude limitation is carried out on the generated multi-carrier synthetic signal as the subject signal.

Preferably, the filtering means should allow the passage of each of one or more of the subcarrier components contained in the multi-carrier synthetic signal with a prescribed output gain.

[First Multi-Carrier Signal Generating Apparatus]

A first multi-carrier signal generating apparatus according to the invention is a multi-carrier signal generating apparatus having multi-carrier signal generating means for generating a multi-carrier signal in a digital form containing a plurality of subcarrier components, and amplitude limiting means for limiting the amplitude of the generated multi-carrier signal, wherein the amplitude limiting means has differential signal generating means for generating a differential signal representing the difference between the portion of the generated multi-carrier signal to be limited in amplitude in excess of any limit prescribed for the amplitude of the multi-carrier signal and the limit, one or more filtering means for filtering the generated differential signal, each of the filtering means taking out one of one or more combinations of a plurality of bands contained in the multi-carrier signal, the taken-out one differing from that or those taken out by other filtering means, and limiting means for limiting the level of the multi-carrier signal by subtracting from the generated multi-carrier signal one or more combinations of a plurality of bands taken out of the differential signal.

Preferably, the multi-carrier signal generating apparatus should have multi-carrier signal generating means for generating a multi-carrier signal in a digital form containing a plurality of subcarrier components, and a plurality of amplitude limiting means each for limiting the amplitude of the generated multi-carrier signal, wherein each of the plurality of amplitude limiting means has differential signal generating means for generating a differential signal representing the difference between the portion of the generated multi-carrier signal to be limited in amplitude in excess of any limit prescribed for the amplitude of the multi-carrier signal and the limit; filtering means for filtering the generated differential signal, the filtering means taking out one of one or more combinations of a plurality of bands contained in the multi-carrier signal, the taken-out one differing from that or those taken out by other filtering means; and limiting means for limiting the level of the multi-carrier signal by subtracting from the generated multi-carrier signal one of the one or more combinations of a plurality of bands taken out of the differential signal, each limiting the level of the multi-carrier signal entered from the multi-carrier signal generating means or the amplitude limiting means of the preceding stage.

Preferably, each of the filtering means should take out one, differing from that or those taken out by the filtering means of the other amplitude limiting means, of the one or more combinations of a plurality of bands contained in the multi-carrier signal, with the same gain as or a different gain from those of the filtering means of the other amplitude limiting means.

Preferably, each of the filtering means should take out one of the one or more combinations of a plurality of subcarrier component bands contained in the multi-carrier signal.

Preferably, the multi-carrier signal generating apparatus should be further provided with digital-to-analog converting means for converting the multi-carrier signal whose level is limited into transmission signals in an analog form, and power amplifying means for amplifying the power of the analog form transmission signals.

BRIEF DESCRIPTION OF THE DRAWINGS

FIG. 1 illustrates the configuration of a first OFDM transmitter used as an example for explaining the background of the present invention.

FIG. 2 shows an example of the hardware configuration of a transmission data generating unit shown in FIG. 1.

FIG. 3 shows the configuration of an orthogonal modulating unit shown in FIG. 1.

FIG. 4 shows a peak amplitude of transmission signals generated by the OFDM transmitter shown in FIG. 1 and elsewhere by way of a specific example in which the number of subcarriers is eight.

FIG. 5 illustrates the configuration of a second OFDM transmitter 2 according to the invention.

FIG. 6 illustrates a typical operation of the peak suppressing unit shown in FIG. 5; (A) shows the relationship between the value of transmission data generated by the transmission data generating unit (FIG. 1 and FIG. 5) and thresholds, and (B), the values of differential data supplied by the subtractor of the peak suppressing unit (FIG. 5).

FIG. 7 illustrates a typical value of data supplied by the limiter of the peak suppressing unit shown in FIG. 5.

FIG. 8 shows the configuration of the FIR filter unit 22 shown in FIG. 5.

FIG. 9 shows an example of an impulse response of the FIR filter unit shown in FIG. 5 and FIG. 8.

FIG. 10 shows an example of filter output data resulting from filtering by the FIR filter unit of differential data generated by the limiter (FIG. 5) and the subtractor from transmission data whose example is shown in FIG. 4.

FIG. 11 shows an example of transmission data whose peak is suppressed by the subtraction of differential data from transmission data, an example of which is shown is FIG. 4, by the subtractor shown in FIG. 5 (peak-suppressed transmission data).

FIG. 12 illustrates a typical value of transmission data generated by the peak suppressing unit shown in FIG. 5.

FIG. 13 illustrates the configuration of a third OFDM transmitter according to the invention.

FIG. 14 illustrates the configuration of a fourth OFDM transmitter according to the invention.

FIG. 15 shows an example of peak suppression performed on transmission data by the peak suppressing unit of an OFDM transmitter.

FIG. 16 shows examples of peaks that may arise where transmission data contain 16 subcarriers.

FIG. 17 shows examples of impulse responses which the FIR filter unit shown in FIG. 5 and FIG. 8 should manifest to allow passage of the bands of the 16 subcarriers shown in FIG. 16.

FIG. 18 shows an example of a synthetic impulse response obtained by synthesizing the impulse responses shown in FIG. 17.

FIG. 19 shows the values of filter output data supplied by the FIR filter unit (FIG. 8) manifesting the impulse response whose examples are shown in FIG. 18.

FIG. 20 illustrates the configuration of a fifth OFDM transmitter according to the invention.

FIG. 21 shows an example of transmission data whose peaks are suppressed by the fifth OFDM transmitter shown in FIG. 20.

FIG. 22 illustrates the configuration of a sixth OFDM transmitter according to the invention.

FIG. 23 illustrates the configuration of the fourth peak suppressing unit shown in FIG. 22.

DETAILED DESCRIPTION OF THE PREFERRED EMBODIMENT

[Background of the Present Invention]

To facilitate understanding of the present invention, the background circumstances which led to the invention will first be described.

[First OFDM Transmitter 1]

FIG. 1 illustrates the configuration of a first OFDM transmitter 1 used as an example for explaining the background of the invention.

As shown in FIG. 1, the first OFDM transmitter 1 comprises a transmission data generating unit 10 and a transmitter unit 12.

The transmission data generating unit 10 is configured of a serial-to-parallel converter unit (S/P) 100, n (n is an integer not smaller than 2) mapping units 102-1 through 102-$n$, an IFFT unit 104 and an orthogonal modulating unit 110.

The transmitter unit 12 is configured of a digital-to-analog converter circuit (D/A) 120, a local oscillator circuit 122, a frequency converter circuit 124 and a power amplifier (TX-AMP) 126.

The OFDM transmitter 1, using these constituent parts, generates transmission signals of the OFDM system from digital original data serially entered from an external apparatus (not shown), and transmits them to a radio line.

In the following description, where any one of a plurality of constituent parts, such as the mapping units 102-1 through 102-n, is to be mentioned without specifying which, it may be referred to simply as the mapping unit 102 for instance.

FIG. 2 shows an example of a hardware configuration of the transmission data generating unit 10 shown in FIG. 1.

For instance, the constituent elements of the transmission data generating unit 10 can be realized by hardware with a custom LSI or the like.

Alternatively, for instance, the constituent elements of the transmission data generating unit 10 can be realized by software.

Where the transmission data generating unit 10 is realized software-wise, a DSP circuit 14, an example of which is shown in FIG. 2 for instance, is used as a hardware item to execute the function of the transmission data generating unit 10.

As shown in FIG. 2, the DSP circuit 14 comprises an input interface circuit (input IF) 140 for accepting original data from an external apparatus, a digital signal processor (DSP) 142 for executing the function of the transmission data generating unit 10 stored in a ROM 144 as a program by use of a RAM 146 or the like, and an output IF 148 for supplying the transmitter unit 12 with transmission data obtained as a result of processing by the transmission data generating unit 10.

In the transmission data generating unit 10 (FIG. 1), the S/P 100 converts original data entered from an external apparatus into a parallel form, and supplies them to the mapping units 102-1 through 102-$n$ as n symbols #1 through #n.

Where the transmission data generating unit 10 performs modulation by, for instance, binary phase shift keying (BPSK), each of symbols #1 through #n contains one bit of data.

Or, where the transmission data generating unit 10 performs, for instance, 16 quadrature amplitude modulation (QAM), each of symbols #1 through #n contains four bits of data.

Each of the mapping units 102 maps the symbols entered from the S/P 100 at signal points in accordance with the modulation system of the transmission data generating unit 10.

Thus, each of the mapping units 102 performs modulation by relating the symbols to the phase and amplitude of a certain carrier.

The IFFT unit 104 subjects to inverse FFT (IFFT) processing the n symbols (n mapped data) mapped at signal points, entered from the mapping units 102-1 through 102-n.

Thus, the IFFT unit 104 batch-converts mapped data in the frequency region generated by the mapping units 102-1 through 102-n into the time region, and supplies the resultant transmission data to the orthogonal modulating unit 110 as modulation data of I components and Q components.

FIG. 3 illustrates the configuration of the orthogonal modulating unit 110 shown in FIG. 1.

As shown in FIG. 3, the orthogonal modulating unit 110 comprises a carrier generator 112, mixers 114-1 and 114-2, a phase shifter 116 and an adder 118.

The orthogonal modulating unit 110 performs digital arithmetic operations using these constituent parts or elements capable of performing similar processing to these constituent parts, orthogonally modulates a carrier Lo1 with modulation data of I components and Q components entered from the IFFT unit 104 to generate transmission data, and supplies the generated data to the transmitter unit 12.

In the orthogonal modulating unit 110, the carrier generator 112 generates digital carrier data representing the carrier signal Lo1, and supplies them to the first mixer 114-1 and the phase shifter 116.

The phase shifter 116 shifts the phase of the carrier data entered from the carrier generator 112 by 90°, and supplies the phase-shifted data to the second mixer 114-2.

The first mixer 114-1 mixes by multiplication the modulation data of I components entered from the IFFT unit 104 (FIG. 1) and the carrier data entered from the carrier generator 112, and supplies the data resulting from this processing to the adder 118.

The second mixer 114-2 mixes by multiplication the modulation data of Q components entered from the IFFT unit 104 and the 90° phase-shifted carrier data entered from the phase shifter 116, and supplies the data resulting from this processing to the adder 118.

The adder 118 adds the data entered from the mixers 114-1 and 114-2, and supplies the added data to the transmitter unit 12 (FIG. 1) as transmission data.

In the transmitter unit 12 (FIG. 1), the D/A 120 converts digital transmission data entered from the adder 118 (FIG. 3) of the transmission data generating unit 10 into analog transmission signals.

Further, the D/A 120 filters the generated transmission signals to clear them of unnecessary frequency components, and supplies the cleared signals to the frequency converter circuit 124.

The local oscillator circuit 122 generates an analog frequency converting signal Lo2 to be used for converting the transmission signals entered from the D/A 120 to a desired frequency, and supplies it to the frequency converter circuit 124.

The frequency converter circuit 124 mixes by analog processing the transmission signals entered from the D/A 120 and the frequency converting signal Lo2 entered from the local oscillator circuit 122 to convert them into transmission signals of a desired frequency.

The power amplifier 126 amplifies in power the transmission signals entered from the frequency converter circuit 124, and transmits the amplified signals to the radio line via an antenna 128.

[Peaks Arising in Transmission Signals]

Since the OFDM transmitter 1 transmits the transmission data superposed over a plurality of subcarriers as described above, the transmission signals generated by the OFDM transmitter 1 contain a plurality of subcarriers, but there is no correlation among these subcarriers.

Therefore, coincidence in phase may occur among the plurality of subcarriers, and this phase coincidence would give rise to peaks in the amplitude of transmission signals obtained by synthesizing the plurality of subcarriers.

The peaks arising in the amplitude of transmission signals will be further explained with reference to FIG. 4.

FIG. 4 shows a peak amplitude of transmission signals generated by the OFDM transmitter 1 shown in FIG. 1 and elsewhere by way of a specific example in which the number of subcarriers is eight.

As shown in FIG. 4, each of the eight subcarriers can be represented by a sine wave taking a phase which matches the value of data used for modulation.

If all these subcarriers become identical in phase as shown in the middle of FIG. 4, even if the amplitudes of individual ones are not so great, the amplitude of the sum of these transmission signals will manifest a conspicuous peak.

As such, a high peak in the amplitude of transmission signals would fall on a nonlinear part of the amplification characteristics of the power amplifier 126 (FIG. 1) and be amplified in power, which would cause the trouble that transmission signals supplied by the power amplifier 126 are distorted and give rise to spurious signals.

A conceivable solution to avoid this trouble is to use an amplifier with a large power output as the power amplifier 126.

However, this solution would entail not only a large power amplifier 126 but also greater power consumption and heat generation, inevitably increasing the size and price of the whole OFDM transmitter 1.

Another conceivable solution is to suppress the amplitude of transmission signals by simply limiting it so as not to exceed prescribed thresholds.

However, merely limiting the amplitude of transmission signals would give rise to many distortions in transmission signals due to the suppression of the amplitude itself.

Therefore, merely limiting the amplitude of transmission signals would not be an appropriate solution to this trouble.

A second OFDM transmitter 2 and a third OFDM transmitter 3 according to the present invention to be described below can effectively obviate the trouble which the above-described first OFDM transmitter 1 is subject to.

[Preferred Embodiments]

Preferred embodiments of the present invention will be described below.

FIG. 5 illustrates the configuration of a second OFDM transmitter 2 according to the invention.

As shown in FIG. 5, the second OFDM transmitter 2 comprises a transmission data generating unit 10, a peak suppressing unit 20 and a transmitter unit 12.

With these constituent parts, as explained with reference to FIG. 4, the second OFDM transmitter 2 effectively suppresses the peak of the amplitude occurring in the transmission signals of the first OFDM transmitter 1, and transmits relatively distortion-free transmission signals.

Out of the constituent parts of the second OFDM transmitter 2, those substantially the same as their counterparts in the first OFDM transmitter 1 shown in FIG. 1 and elsewhere are denoted by respectively the same reference signs.

The function of the peak suppressing unit 20, like that of the transmission data generating unit 10, can be realized either by hardware or by software by use of the DSP circuit 14 (FIG. 2) for instance.

In the second OFDM transmitter 2, too, the transmission data generating unit 10, like that of the OFDM transmitter 1, generates digital transmission data from digital original data entered from an external apparatus (not shown).

The transmission data generating unit 10 supplies the generated transmission data to the peak suppressing unit 20.

As shown in FIG. 5, the peak suppressing unit 20 comprises delay units 200, a limiter 202, subtractors 204 and 206, and a FIR filter unit 22.

With these constituent parts, the peak suppressing unit 20 processes transmission data entered from the transmission data generating unit 10, and suppresses a peak occurring in the amplitude of transmission signals generated by the D/A 120 (FIG. 1) of the transmitter unit 12.

Constituent parts of the peak suppressing unit 20 will be described below.

FIG. 6 illustrates a typical operation of the peak suppressing unit 20 shown in FIG. 5; (A) shows the relationship between the value of transmission data generated by the transmission data generating unit 10 (FIG. 1 and FIG. 5) and thresholds, and (B), the values of differential data supplied by the subtractor 204 of the peak suppressing unit 20 (FIG. 5).

FIG. 7 illustrates a typical value of data supplied by the limiter 202 of the peak suppressing unit 20 shown in FIG. 5.

In the peak suppressing unit 20, the limiter 202 limits the level of transmission data within prescribed thresholds.

Thus, as shown in FIG. 6(A), the limiter 202 reduces any higher levels of transmission data entered from the transmission data generating unit 10 than the threshold+ in the positive region to the threshold+.

Further as shown in FIG. 6(A), the limiter 202 raises any lower levels of transmission data entered from the transmission data generating unit 10 than the threshold− in the negative region to the threshold−.

By the processing described above, the limiter 202 limits the levels of transmission data as shown in FIG. 7, and supplies the level-limited data to the subtractor 204.

The threshold+ and threshold− shown in FIG. 6(A) are set to levels determined by experiment, calculation or simulation such that, when the transmission data is converted by the D/A 120 (FIG. 1) of the transmitter unit 12 into transmission signals and amplified by the power amplifier 126, the transmission signals may suffer no distortion.

The subtractor 204 subtracts the output data of the limiter 202 shown in FIG. 7 from the transmission data shown in FIG. 6(A) to generate differential data shown in FIG. 6(B), and supplies them to the FIR filter unit 22.

FIG. 8 shows the configuration of the FIR filter unit 22 shown in FIG. 5.

As shown in FIG. 8, the FIR filter unit 22 comprises m (m is a positive integer) delay units 220-1 through 220-$m$ for delaying the entered transmission data, m+1 multipliers 222-0 through 222-$m$ for multiplying the transmission data delayed by the delay units 220-1 through 220-$m$ by coefficients a0 through am, respectively, and an adder 224 for adding the transmission data multiplied by the multipliers 222-0 through 222-$m$ by the coefficients.

FIG. 9 shows an example of an impulse response of the FIR filter unit 22 shown in FIG. 5 and FIG. 8.

FIG. 10 shows an example of filter output data resulting from filtering by the FIR filter unit 22 of differential data generated by the limiter 202 (FIG. 5) and the subtractor 204 from transmission data whose example is shown in FIG. 4.

With these constituent parts, the FIR filter unit 22 filters differential data (FIG. 6(B)) entered from the subtractor 204 and supplies the filtered data to the subtractor 206.

The FIR filter unit 22 manifests impulse response characteristics shown in FIG. 9, which may be, for instance, band pass filter (BPF) characteristics having as its pass band subcarrier No. 8 of the highest frequency among the subcarriers shown in FIG. 4.

The levels of the sampled points of differential data (FIG. 5) generated by the limiter 202 and the subtractor 204 from the transmission data shown in FIG. 4 are convoluted by the FIR filter unit 22, resulting in filter output data shown in FIG. 10.

Thus, in the example shown in FIG. 10, the differential data generated by the limiter 202 and the subtractor 204 is filtered by the FIR filter unit 22 manifesting the BPF characteristics having as its pass band subcarrier No. 8 shown in FIG. 4, and thereby cleared of other components than the band of subcarrier No. 8.

The delay units 200 delay the transmission data for as long as the duration of processing by the limiter 202, the subtractor 204 and the FIR filter unit 22, and supply the delayed data to the subtractor 206.

Thus, the delay units 200 compensate for delays in processing by the limiter 202, the subtractor 204 and the FIR filter unit 22 by delaying the transmission data, and coordinate the timing between the transmission data and the filter output data (FIG. 5 and FIG. 8).

FIG. 11 shows an example of transmission data whose peak is suppressed by the subtraction of differential data from transmission data, an example of which is shown is FIG. 4, by the subtractor 206 shown in FIG. 5 (peak-suppressed transmission data).

The subtractor 206 subtracts the filter output data, entered from the FIR filter unit 22, from the transmission data entered from the delay units 200 to suppress the peak occurring in the transmission data.

Thus, the subtractor 206 generates peak-suppressed transmission data as shown in FIG. 11 by subtracting the filter output data (FIG. 10) generated by the FIR filter unit 22 from the transmission data whose peak is not suppressed (original waveform; FIG. 4), and supplies them to the transmitter unit 12.

The transmitter unit 12 (FIG. 5), like that in the OFDM transmitter 1 (FIG. 1), converts the peak-suppressed transmission data generated by the peak suppressing unit 20 into an analog form, converts their frequency, amplifies them in power, and transmits the data so processed.

[Characteristics of OFDM Transmitter 2]

FIG. 12 illustrates a typical level of transmission data generated by the peak suppressing unit 20 shown in FIG. 5.

If, for instance, the level of transmission data generated by the transmission data generating unit 10 is simply limited by use of the threshold+ and the threshold− (FIG. 6(A)), the transmission signals derived from the transmission data so limited will manifest a discontinuous waveform as shown in FIG. 7, and involve many distortions.

By contrast, if the level of the transmission data is suppressed by the peak suppressing unit 20 subtracting the differential data filtered by the FIR filter unit 22 from the transmission data to convert them into peak-suppressed transmission data (FIG. 5), the wave form of transmission signals derived by the transmitter unit 12 from the peak-suppressed transmission data will be smooth as shown in FIG. 12, and involve few distortions.

Moreover, as the FIR filter unit 22 (FIG. 5 and FIG. 8) passes only the band component of a specific subcarrier, the peak suppressing unit 20 reduces the amplitude of only the specific subcarrier but not those of other subcarriers.

Therefore, the use of the peak suppressing unit 20 enables the peak level to be suppressed effectively while maintaining the subcarrier components contained in the pre-processed transmission data.

The extent of attenuation of the specific subcarrier by the FIR filter unit 22 is adjustable, and by adjusting this extent of attenuation, the attenuation of the specific subcarrier by the peak suppressing unit 20 can be kept within a range wherein the total wattage contained in one symbol length may not be affected.

By controlling the extent of attenuation of the specific subcarrier with the peak suppressing unit 20 in this way, it is made possible to receive signals from the OFDM transmitter 2 and to prevent the deterioration of demodulation characteristics when the signals are demodulated.

As described so far, the OFDM transmitter 2 according to the present invention can effectively suppress any peak arising in transmission signals with a relatively small quantity of hardware or of computation and to reduce distortions of transmission signals ensuing from peak suppression.

The OFDM transmitter 2 according to the invention, even though it can effectively reduce distortions of transmission signals and prevent band leaks, can minimize adverse effects on demodulation characteristics on the reception side.

[Modification 1]

A first modification of the OFDM transmitter according to the invention will be described below.

FIG. 13 illustrates the configuration of a third OFDM transmitter 3 according to the invention.

As shown in FIG. 13, the third OFDM transmitter 3 has a configuration in which the first peak suppressing unit 20 in the second OFDM transmitter 2 (FIG. 5 and elsewhere) is replaced with a second peak suppressing unit 24.

The second peak suppressing unit 24 has a configuration in which the FIR filter unit 22 is replaced with a plurality of FIR filter units 22-1 through 22-k (k is an integer of not smaller than 2; FIG. 13 shows the case of k=2), and a switching unit 208 and a level determination unit 210 are added.

Of the constituent parts of the OFDM transmitter 3 shown in FIG. 13, those substantially the same as their counterparts in the OFDM transmitters 1 and 2 respectively shown in FIG. 1 and FIG. 5 are denoted by respectively the same reference signs.

The FIR filter units 22-1 and 22-2 have substantially the same configuration as the FIR filter unit 22 of the OFDM transmitter 2 shown in FIG. 5 and FIG. 8, and have different subcarriers as their respective pass bands.

Each of the FIR filter units 22-1 and 22-2 passes the band of one different subcarrier out of the subcarriers contained in the transmission data, and supplies it to the switching unit 208 as filter output data.

The switching unit 208, under the control of the level determination unit 210, selects either one of the sets of filter output data provided by the FIR filter units 22-1 and 22-2, and supplies it to the subtractor 206.

The level determination unit 210 assesses the quality of the peak-suppressed transmission data supplied by the subtractor 206 and controls, on the basis of the result of this assessment, the switching unit 208 to cause one of the sets of filter output data supplied by the FIR filter units 22-1 and 22-2 which would provide peak-suppressed transmission data of better quality to be selected.

Standards according to which the level determination unit 210 assesses the quality of peak-suppressed transmission data include, for instance, whether or not the level of peak-suppressed transmission data has exceeded the threshold+ or the threshold− beyond a certain number of samples.

The change-over of the switching unit 208 can be made independent of control by the level determination unit 210, such as at regular intervals of time or sampling intervals.

[Modification 2]

A second modification of the OFDM transmitter according to the invention will be described below.

FIG. 14 illustrates the configuration of a fourth OFDM transmitter 4 according to the invention.

As shown in FIG. 14, the fourth OFDM transmitter 4 has a configuration in which the second OFDM transmitter 2 (FIG. 5 and elsewhere) is provided with a plurality of first peak suppressing units 20-1 through 20-k (FIG. 14 shows a case of k=2).

Of the constituent parts of the OFDM transmitter 4 shown in FIG. 14, those substantially the same as their counterparts in the OFDM transmitters 1 through 3 shown in FIG. 1, FIG. 5, FIG. 13 and elsewhere are denoted by respectively the same reference signs.

Noted that, in the OFDM transmitter 4, the FIR filter units 22 (not shown in FIG. 14; instead see FIG. 5, FIG. 8 and elsewhere) contained in the peak suppressing units 20-1 and 20-2 have different subcarrier bands as their pass bands.

Further, the FIR filter units 22 contained in the peak suppressing units 20-1 and 20-2 are so adjusted as to attenuate more of the subcarrier band components that they pass than is done by the FIR filter unit 22 of the OFDM transmitter 1 or 3, i.e. to be smaller in output gain.

In the OFDM transmitter 4, the transmission data generating unit 10 generates transmission data from original data like its counterparts in the OFDM transmitters 1, 2 and 3 (FIG. 1, FIG. 5 and FIG. 13, respectively), and supplies them to the peak suppressing unit 20-1.

FIG. 15 shows an example of peak suppression performed on transmission data by the peak suppressing units 20-1 and 20-2 of the OFDM transmitter 4.

As shown in FIG. 15, the peak suppressing unit 20-1 suppresses the peak of transmission data by attenuating the band of a specific subcarrier contained in the transmission data where they exceed either a prescribed threshold as does the peak suppressing unit 20 in the OFDM transmitter 2, and supplies the peak-suppressed data to the peak suppressing unit 20-2.

Further as shown FIG. 15, the peak suppressing unit 20-2 suppresses any peak of transmission data by attenuating a subcarrier band which is contained in the part of the transmission data in excess of either prescribed threshold but is different from the subcarrier band attenuated by the peak suppressing unit 20-1, and supplies the peak-suppressed data to the transmitter unit 12.

The transmitter unit 12, as do those in the OFDM transmitters 1, 2 and 3 (FIG. 1, FIG. 5, FIG. 13, respectively), converts the peak-suppressed transmission data entered from the peak suppressing unit 20-2 into transmission signals, converts their frequency, amplifies them in power, and transmits the signals so processed to the radio line.

Thus in the OFDM transmitter 4 (FIG. 14) the peak suppressing units 20-1 and 20-2, by attenuating the levels of different subcarrier band components little by little stepwise, achieve greater peak suppressing effects than the OFDM transmitters 2 and 3 (FIG. 5 and FIG. 13) do while minimizing adverse effects on the subcarrier band components to be limited.

If the extents of peak suppression by the peak suppressing units 20-1 and 20-2 in the OFDM transmitter 4 are differentiated, such as setting the output gain of the FIR filter unit 22 of the peak suppressing unit 20-1 higher and that of the FIR filter unit 22 of the peak suppressing unit 20-2 lower as shown in FIG. 15, the peak suppressing effect on the transmission data can be further improved.

In this case, setting higher the output gain of the FIR filter unit 22 of the peak suppressing unit 20, which is at a closer stage to the transmission data generating unit 10 and setting lower the output gain of the FIR filter unit 22 of the peak suppressing unit 20, which is at a later stage would give a better peak suppressing effect on the transmission data.

Similar effects to those of the OFDM transmitter 4 can also be achieved by other configurations than that in which a plurality of first peak suppressing units 20 (FIG. 5) are connected in multiple stages as shown in FIG. 14, such as one in which the second peak suppressing unit 24 (FIG. 13) is connected after the first peak suppressing unit 20, another in which the first peak suppressing unit 20 is connected after the second peak suppressing unit 24, or still another in which second peak suppressing units 24 are connected in multiple stages.

[Second Embodiment]

A second preferred embodiment of the present invention will be described below.

The second and third OFDM transmitters 2 and 3 (FIG. 5 and FIG. 13) described as the first preferred embodiment of the invention suppress any peak arising in transmission data by attenuating only one specific subcarrier.

Unlike that, a fifth OFDM transmitter 5 (to be described afterwards with reference to FIG. 20 and other drawings), which is the second preferred embodiment of the invention, suppresses any peak arising in transmission data by attenuating a plurality of subcarriers.

[Outline of OFDM Transmitter 5]

First, the manner in which the OFDM transmitter 5 carries out peak suppression will be described.

The following description will be illustrated by a case in which transmission data contains 16 subcarriers.

FIG. 16 shows examples of peaks that may arise where transmission data contains 16 subcarriers.

As shown in FIG. 16, even where transmission data contains 16 subcarriers, as in the case shown in FIG. 4 where transmission data contain eight subcarriers, if many subcarriers coincide in phase, a peak may arise in transmission data.

FIG. 17 shows examples of the impulse responses that the FIR filter unit 22 shown in FIG. 5 and FIG. 8 should manifest to allow passage of the bands of the 16 subcarriers shown in FIG. 16.

In order to let differential data (FIG. 6(B)) derived from transmission data pass any of the 16 subcarriers, assuming the number of taps of each of the FIR filter units 22 (FIG. 8) of the OFDM transmitters 2 through 4 (FIG. 5, FIG. 13, FIG. 14) to be 31 (m=30), the respective coefficients (tap coefficients) a0 through a30 of the multipliers 222-0 through 222-30 can be so set that the FIR filter unit 22 manifests one of the impulse responses shown in FIG. 17.

FIG. 18 shows an example of a synthetic impulse response obtained by synthesizing the impulse responses shown in FIG. 17.

The following description will refer to a specific case in which the transmission data shown in FIG. 16 is to be limited with amplitudes 4 and −4 to generate differential data.

Where the plurality of subcarriers contained in the peak of transmission data are to be attenuated as stated above, i.e. the desired plurality of subcarrier bands contained in differential data (FIG. 6(B)) are to be passed, out of the impulse responses shown in FIG. 17, a plurality of responses matching the subcarrier bands to be passed can be aligned in a center position to enable appropriate output gains to be given to the subcarrier bands that have been passed.

Synthesizing the impulse responses shown in FIG. 17 in this way would provide an impulse response shown in FIG. 18 for instance.

This impulse response results in suppression of other amplitudes than those at the center, as exemplified by those in the ovals in FIG. 18.

[Synthetic FIR Filter]

FIG. 19 shows the values of filter output data supplied by the FIR filter unit 22 (FIG. 8) manifesting the impulse response whose examples are shown in FIG. 18.

If the tap coefficients of the FIR filter unit 22 are so set that the impulse responses shown in FIG. 18 are manifested and differential data (FIG. 6(B)) are entered into the filter unit, the impulse response of every one of the subcarriers to be passed will be synthesized as shown in FIG. 19, and filter output data that is allowed to pass these bands and given appropriate output gains will be obtained.

Such an FIR filter unit 22 that allows a plurality of subcarrier bands to be passed with appropriate output gains will hereinafter be referred to as a synthetic FIR filter.

[Configuration of OFDM Transmitter 5]

FIG. 20 illustrates the configuration of a fifth OFDM transmitter 5 according to the invention.

As shown in FIG. 20, the fifth OFDM transmitter 5 has a configuration in which the second peak suppressing unit 24 of the third OFDM transmitter 3 (FIG. 13) is replaced with a third peak suppressing unit 26.

The third peak suppressing unit 26 has a configuration in which the FIR filters 22-1 and 22-2 of the second peak suppressing unit 24, each passing the band of only one specific subcarrier, are replaced with synthetic FIR filters 260-1 and 260-2, each passing a plurality of subcarrier bands, as described above with reference to FIG. 16 through FIG. 19.

Of the constituent parts of the OFDM transmitter 5 shown in FIG. 20, those substantially the same as their counterparts in the OFDM transmitters 1 through 4 shown in FIG. 1, FIG. 5, FIG. 13, FIG. 14 and elsewhere are denoted by respectively the same reference signs.

Each of the synthetic FIR filters 260-1 and 260-2 passes a plurality of subcarrier bands out of the transmission data, and supplies them to the switching unit 208.

Where the transmission data (differential data) contains 16 subcarriers (No. 1 through No. 16) as shown in FIG. 16 for instance, the synthetic FIR filters 260-1 and 260-2 pass different combinations of subcarrier bands; for example, the synthetic FIR filter 260-1 passes the bands of the first through eighth subcarriers No. 1 through No. 8, and the synthetic FIR filter 260-2 passes those of the ninth through 16th subcarriers No. 9 through No. 16.

[Operation of OFDM Transmitter 5]

The operation of the OFDM transmitter 5 will be described below.

The transmission data generating unit 10 in the OFDM transmitter 5, like its counterparts in the first OFDM transmitter 1 (FIG. 1) and the like, generates transmission data from original data, and supplies it to the peak suppressing unit 26.

In the peak suppressing unit 26 (FIG. 20), a delay unit 200 delays transmission data entered from the transmission data generating unit 10 and supplies the delayed data to a subtractor 206.

A limiter 202 limits the level of transmission data as shown in FIG. 6(A), and supplies the limited data to a subtractor 204.

The subtractor 204 subtracts the data entered from the limiter 202 from the transmission data to generate differential data shown in FIG. 6(B).

The synthetic FIR filter 260-1 passes the bands of the first through eighth subcarriers contained in the transmission data (differential data) to provide filter output data, and supplies it to the switching unit 208 with a prescribed output gain.

The synthetic FIR filter 260-2 passes the bands of the ninth through 16th subcarriers contained in the transmission data (differential data) to provide filter output data, and supplies it to the switching unit 208 with a prescribed output gain.

A level determination unit 210, like its counterpart in the third OFDM transmitter 3 (FIG. 13), controls the switching unit 208 to cause one of the sets of filter output data supplied by the synthetic FIR filters 260-1 and 260-2 which would provide peak-suppressed transmission data of better quality to be selected.

The switching unit 208, as controlled by the level determination unit 210, selects either one of the sets of filter output data provided by the synthetic FIR filters 260-1 and 260-2, and supplies it to the subtractor 206.

The subtractor 206 subtracts the filter output data selected by the switching unit 208 from the delayed transmission data entered from the delay units 200, and supplies the result of subtraction to the transmitter unit 12.

The transmitter unit 12 converts the transmission data whose peaks are suppressed by the peak suppressing unit 26 into transmission signals, and transmits them.

[Characteristics of OFDM Transmitter 5]

FIG. 21 shows an example of transmission data whose peaks are suppressed by the fifth OFDM transmitter 5 shown in FIG. 20.

The OFDM transmitter 5, as shown in FIG. 21, can effectively suppress the peaks of transmission signals without affecting the bands of the transmission data (original waveform) generated by the transmission data generating unit 10 (FIG. 20 and elsewhere).

Setting the tap coefficients of each of the synthetic FIR filters 260-1 and 260-2 (FIG. 20) so as to enable the bands of many subcarriers little by little enables the OFDM transmitter 5 to attenuate little by little every one of the many subcarriers contained in peaks occurring in the transmission data.

It is only when a peak occurs that the OFDM transmitter 5 attenuates transmission data, and usually a peak occurs only for a short period of time relative to one symbol length.

Thus the OFDM transmitter 5 only dispersively supplies a very small quantity of attenuation for a very short period of time to each of the many subcarriers in transmission data.

Therefore, transmission signals whose peaks are suppressed by the OFDM transmitter 5 hardly affect demodulation characteristics on the reception side.

Further, the impulse response of the FIR filter unit 22 (FIG. 8) passing any of the bands of subcarriers contained in transmission data also gives rise to unnecessary peaks in other positions than at the center as shown in FIG. 17.

Moreover, as the impulse response of the FIR filter unit 22 is symmetric laterally, unnecessary peaks arise on both sides of the center, and negative peaks arising on both sides of the center become more conspicuous when the band of the FIR filter unit 22 is narrowed.

Unnecessary peaks in such an impulse response of the FIR filter unit 22 may essentially affect other subcarrier bands than those to be attenuated in peak suppression, for instance by giving rise to new peaks at other points by reflection of signals or by excessive attenuation of signals.

By contrast, in the impulse responses of the synthetic FIR filters 260-1 and 260-2 of the OFDM transmitter 5 (FIG. 20), as shown in FIG. 18, unnecessary peaks in other positions than at the center are evidently suppressed.

Therefore in the OFDM transmitter 5, no trouble such as occurrence of a new peak in another position as a result of peak suppression of transmission data ever arises.

Furthermore, as the number of subcarriers contained in transmission data increases, usually the peaks arising in the transmission data tend to be more acute and greater in amplitude.

To solve this problem, as the number of subcarriers increases, the attenuation that the OFDM transmitter 5 (FIG. 20) has to apply to the band of each individual subcarrier can be made smaller. Therefore, it is suitable for suppressing peaks in transmission data containing many subcarriers.

As described above, in spite of its many advantages, the fifth OFDM transmitter 5 has no more constituent parts than the third OFDM transmitter 3 shown in FIG. 13.

[Modification 3]

While the foregoing description referred to a case in which the synthetic FIR filter 260-1 passes the bands of the first through eighth subcarriers out of the first through 16th subcarriers contained in transmission data (differential data) and the synthetic FIR filter 260-2 passes those of the ninth through 16th subcarriers, instead there may be left subcarrier bands passed by neither of the synthetic FIR filters 260-1 and 260-2 by letting, for instance, the synthetic FIR filter 260-1 pass the bands of the first through fourth subcarriers and the synthetic FIR filter 260-2 pass those of the 13th through 16th subcarriers.

Furthermore, there may be subcarrier bands passed by both of the synthetic FIR filters 260-1 and 260-2 by letting for instance, the synthetic FIR filter 260-1 pass the bands of the first through 10th subcarriers and the synthetic FIR filter 260-2 pass those of the seventh through 16th subcarriers.

Thus it is possible to choose as desired not only the number of synthetic FIR filters 260 but also the subcarrier bands that each of the synthetic FIR filters 260 is to pass.

Where each of the plurality of synthetic FIR filters 260 is to pass only one specific subcarrier band, the synthetic FIR filters 260 are the same in substance as the FIR filters 22, and the fifth OFDM transmitter 5 (the peak suppressing unit 26) containing such synthetic FIR filters 260 is the same in substance as the third OFDM transmitter 3 (the peak suppressing unit 24).

[Modification 4]

A fourth modification of the OFDM transmitter according to the invention will be described below.

FIG. 22 illustrates the configuration of a sixth OFDM transmitter 6 according to the invention.

FIG. 23 illustrates the configuration of the fourth peak suppressing unit 28 shown in FIG. 22.

As shown in FIG. 22, the sixth OFDM transmitter 6 has a configuration in which the first peak suppressing units 20-1 through 20-$k$ of the fourth the OFDM transmitter 4 (FIG. 14) are replaced with fourth peak suppressing units 28-1 through 28-$k$ (FIG. 22 shows the case of k=2).

Of the constituent parts of the OFDM transmitter 6 shown in FIG. 22, those substantially the same as their counterparts in the first through fifth OFDM transmitters 1 through 5 shown in FIG. 1 and elsewhere are denoted by respectively the same reference signs.

As shown in FIG. 23, the fourth peak suppressing units 28-1 and 28-2 in the OFDM transmitter 6 have a configuration in which the respective FIR filters 22 of the first peak suppressing units 20-1 and 20-2 (FIG. 5) are replaced with the synthetic FIR filters 260-1 and 260-2 shown in FIG. 20 (not shown in FIG. 22).

The transmission data generating unit 10 in the OFDM transmitter 6, like its counterparts in the first OFDM transmitter 1 (FIG. 1) and the like, generates transmission data from original data, and supplies the resultant peak-suppressed transmission data to the peak suppressing unit 28-1.

The peak suppressing unit 28-1 suppresses any peak in transmission data by attenuating the bands of a plurality of subcarriers contained in the transmission data where the level exceeds either prescribed threshold, and supplies the peak-suppressed transmission data to the peak suppressing unit 28-2.

The peak suppressing unit 28-2 suppresses any peak in transmission data by attenuating the bands of a plurality of subcarriers contained in the transmission data where the level exceeds either prescribed threshold and the combination of a plurality of subcarrier bands differs from that of the plurality of subcarrier bands attenuated by the peak suppressing unit 28-1, and supplies the resultant peak-suppressed transmission data to the transmitter unit 12.

The transmitter unit 12, like its counterparts in the first OFDM transmitter 1 (FIG. 1) and the like, converts the transmission data entered from the peak suppressing unit 20-2 into transmission signals, converts their frequency, amplifies them in power, and transmits the signals so processed to the radio line.

Thus in the sixth OFDM transmitter 6, as in the fourth OFDM transmitter 4 (FIG. 14), it is also conceivable to differentiate the extents of peak suppression by the peak suppressing units 28-1 and 28-2, such as setting the output gain of the synthetic FIR filter 260-1 (not shown in FIG. 22) of the peak suppressing unit 28-1 higher and that of the synthetic, FIR filter 260-2 lower.

As in the OFDM transmitter 6, it is possible to further disperse the attenuation of subcarriers contained in transmission data by suppressing the peaks of the transmission data stepwise, and in this way peaks of transmission signals can be suppressed even more effectively.

The sixth OFDM transmitter 6 can also be modified in the same way as the second modification of the OFDM transmitter according to the invention described with reference to FIG. 14.

As hitherto described, the amplitude limiting apparatus according to the present invention can effectively suppress peak levels of the amplitude of transmission signals in a multi-carrier communication system or the like.

What is claimed is:

1. An amplitude limiting apparatus having:
    differential signal generating means for generating a differential signal representing a difference between a portion of a subject signal to be limited in amplitude in excess of a limit prescribed for the amplitude of the subject signal and the limit, and
    amplitude limiting means for limiting the amplitude of the subject signal by subtracting the generated differential signal from the subject signal.

2. The amplitude limiting apparatus according to claim 1, further having a filtering means for filtering the generated differential signal to pass only a prescribed band content of the differential signal, wherein:
    the amplitude limiting means limits the amplitude of the subject signal by subtracting the filtered generated differential signal from the subject signal.

3. The amplitude limiting apparatus according to claim 2, wherein
    the subject signal is in a digital form, and
    each of the differential signal generating means, the amplitude limiting means and the filtering means carried out by digital processing respectively to generate the differential signal, limit the amplitude of the subject signal and filter the differential signal.

4. The amplitude limiting apparatus, according to claim 3, further including a mapping means for mapping digital transmission signals to be transmitted in a plurality of symbols, and
    IFFT processing means for subjecting the plurality of symbols obtained by the mapping to IFFT processing to generate a multi-carrier synthetic signal in a digital form containing a plurality of subcarrier components, wherein
    the limiting of the amplitude is carried out on the generated multi-carrier synthetic signal as the subject signal.

5. The amplitude limiting apparatus according to claim 4, wherein the filtering means allows the passage of one or more of the subcarrier components contained in the multi-carrier synthetic signal with a prescribed output gain.

6. A multi-carrier signal generating apparatus having:
    multi-carrier signal generating means for generating a multi-carrier signal in a digital form containing a plurality of subcarrier components, and
    amplitude limiting means for limiting an amplitude of the generated multi-carrier signal,
    the amplitude limiting means including:
    differential signal generating means for generating a differential signal representing a difference between a portion of the generated multi-carrier signal to be limited in amplitude in excess of limit prescribed for the amplitude of the multi-carrier signal and the limit,
    one or more filtering means for filtering the generated differential signal, each of the filtering means filtering out one of one or more bands contained in the multi-carrier signal, each filtered-out band differing from that or those bands taken out by another one of the one or more filtering means, and
    limiting means for limiting the level of the multi-carrier signal by subtracting from the generated multi-carrier signal one or more of the bands filtered out of the differential signal.

7. The multi-carrier signal generating apparatus, according to claim 6, wherein each of the filtering means filters out one of the one or more bands contained in the multi-carrier signal.

8. The multi-carrier signal generating apparatus, according to claim 6, further provided with digital-to-analog converting means for converting the multi-carrier signal whose level is limited into transmission signals in an analog form, and
    power amplifying means for amplifying power of the analog form transmission signals.

9. A multi-carrier signal generating apparatus having:
    multi-carrier signal generating means for generating a multi-carrier signal in a digital form containing a plurality of subcarrier components, and
    a plurality of amplitude limiting means each for limiting an amplitude of the generated multi-carrier signal,
    each of the plurality of amplitude limiting means including:
    differential signal generating means for generating a differential signal representing a difference between a portion of the generated multi-carrier signal to be limited in amplitude in excess of a limit prescribed for the amplitude of the multi-carrier signal and the limit, filtering means for filtering the generated differential signal, the filtering means filters out one of one or more bands contained in the multi-carrier signal, each filtered-out band differing from another band filtered out by the filtering means, and limiting means for limiting a level of the multi-carrier signal by subtracting from the generated multi-carrier signal one of the one or more of the bands filtered out of the differential signal, each limiting of the level of the multi-carrier signal entered from the multi-carrier signal generating means or the amplitude limiting means of a preceding stage.

10. The multi-carrier signal generating apparatus, according to claim 9, wherein each of the filtering means filters out one, differing from that or those filtered out by the filtering means of another amplitude limiting means, of the one or more combinations of a plurality of bands contained in the multi-carrier signal, with the same gain as or a different gain from those of the filtering means of the another amplitude limiting means.

* * * * *